(12) United States Patent
Choi

(10) Patent No.: US 9,842,822 B2
(45) Date of Patent: Dec. 12, 2017

(54) SEMICONDUCTOR PACKAGES WITH SOCKET PLUG INTERCONNECTION STRUCTURES

(71) Applicant: SK hynix Inc., Icheon-si, Gyeonggi-do (KR)

(72) Inventor: Hyeong Seok Choi, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/831,463

(22) Filed: Aug. 20, 2015

(65) Prior Publication Data

US 2016/0293565 A1  Oct. 6, 2016

(30) Foreign Application Priority Data

Apr. 6, 2015 (KR) .......................... 10-2015-0048674

(51) Int. Cl.
*H01L 23/00* (2006.01)
*H01L 25/065* (2006.01)
(Continued)

(52) U.S. Cl.
CPC .............. *H01L 24/72* (2013.01); *H01L 24/05* (2013.01); *H01L 24/13* (2013.01); *H01L 24/16* (2013.01); *H01L 24/17* (2013.01); *H01L 24/81* (2013.01); *H01L 24/90* (2013.01); *H01L 25/0657* (2013.01); *H01L 25/0756* (2013.01); *H01L 25/117* (2013.01); *H01L 24/94* (2013.01); *H01L 24/97* (2013.01); *H01L 2224/0401* (2013.01); *H01L 2224/05571* (2013.01); *H01L 2224/05611* (2013.01); *H01L 2224/05647* (2013.01); *H01L 2224/13012* (2013.01); *H01L 2224/13014* (2013.01); *H01L 2224/13016* (2013.01); *H01L 2224/13078* (2013.01); *H01L 2224/13082* (2013.01); *H01L 2224/13111* (2013.01); *H01L 2224/13147* (2013.01); *H01L 2224/13191* (2013.01); *H01L 2224/13193* (2013.01);
(Continued)

(58) Field of Classification Search
CPC . H01L 24/72; H01L 25/0657; H01L 25/0756; H01L 25/117; H01L 2021/60022; H01L 2021/60067; H01L 2225/06513
See application file for complete search history.

(56) References Cited

U.S. PATENT DOCUMENTS 8,710,670 B2 *  4/2014  Kim .................. H01L 21/76898
257/774
2003/0042595 A1 *  3/2003  Canella ................ G01R 1/0466
257/690
(Continued)

FOREIGN PATENT DOCUMENTS

KR  1020050029602 A  3/2005

*Primary Examiner* — Phat X Cao
(74) *Attorney, Agent, or Firm* — William Park & Associates Ltd.

(57) ABSTRACT

A semiconductor package may include a first substrate and a second substrate. Socket bumps may be disposed on the first substrate to provide insertion grooves within the socket bumps. Plug bumps may be disposed on the second substrate. The plug bumps may be configured for insertion into the insertion grooves of the socket bumps and may electrically connect to the socket bumps. Related memory cards and electronic systems may also be provided.

16 Claims, 13 Drawing Sheets

(51) Int. Cl.
*H01L 25/075* (2006.01)
*H01L 25/11* (2006.01)

(52) U.S. Cl.
CPC ............ *H01L 2224/16147* (2013.01); *H01L 2224/16148* (2013.01); *H01L 2224/16237* (2013.01); *H01L 2224/16238* (2013.01); *H01L 2224/1703* (2013.01); *H01L 2224/81191* (2013.01); *H01L 2224/81192* (2013.01); *H01L 2224/81193* (2013.01); *H01L 2224/94* (2013.01); *H01L 2224/97* (2013.01)

(56) References Cited

U.S. PATENT DOCUMENTS

2011/0140105 A1\* 6/2011 Maruyama .............. H01L 22/32
 257/48
2013/0313704 A1\* 11/2013 Souriau .................. H01L 24/16
 257/737
2015/0333026 A1\* 11/2015 Gandhi ............... H01L 23/4012
 257/737

\* cited by examiner

FIG. 4
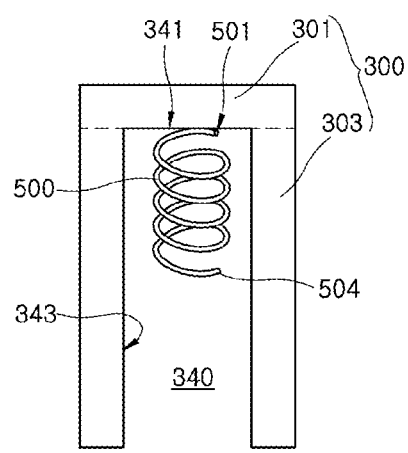
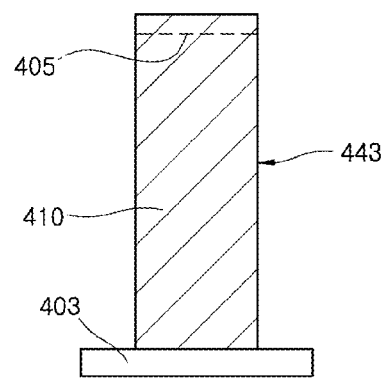

SEMICONDUCTOR PACKAGES WITH SOCKET PLUG INTERCONNECTION STRUCTURES

CROSS-REFERENCE TO RELATED APPLICATION

The present application claims priority under 35 U.S.C 119(a) to Korean Application No. 10-2015-0048674, filed on Apr. 6, 2015, in the Korean intellectual property Office, which is incorporated herein by reference in its entirety.

BACKGROUND

1. Technical Field

Various embodiments may relate to a packaging technology and, more particularly, to semiconductor packages with socket plug interconnection structures.

2. Related Art

Semiconductor packages capable of processing a large amount of data are increasingly in demand with the development of smaller electronic systems such as mobile systems. In response to such a demand, it may be necessary to increase the integration density of semiconductor devices used in the electronic systems. Also, as the interest in the portable and wearable electronics increases, flexibility properties of the electronic systems become more increasingly required. The flexibility of electronic components such as semiconductor packages constituting the electronic systems is required.

As a semiconductor chip may have a thickness susceptible to being bent, the possibility of realizing flexible semiconductor packages has been gradually increasing. Accordingly, a lot of effort has been focused on the interconnection structure electrically connecting the chips of the semiconductor devices to each other, electrically connecting the chips to a package substrate, or electrically connecting substrates to each other, even when the chip or substrate of the semiconductor devices is bent or warped.

SUMMARY

According to an embodiment, there may be provided a semiconductor package. The semiconductor package may include a first substrate and socket bumps disposed on the first substrate and configured for providing insertion grooves. The semiconductor package may include a second substrate and plug bumps disposed on the second substrate. Each of the plug bumps may be configured for insertion into each of the insertion grooves, respectively, to electrically connect to the socket bumps, respectively.

According to an embodiment, there may be provided a semiconductor package. The semiconductor package may include a first substrate including bump grooves included in the first substrate and formed in the first substrate adjacent to a surface of the first substrate. The semiconductor package may include socket bumps respectively disposed in the bump grooves. Each of the socket bumps may cover a bottom portion and a sidewall portion of any one of the bump grooves to provide an insertion groove within the socket bump. A second substrate may be disposed to face the first substrate. Plug bumps disposed on the second substrate and inserted into the insertion grooves of the socket bumps. The plug bumps may be electrically connected to the socket bumps, respectively. The bump groves may be concave.

According to an embodiment, there may be provided a semiconductor package. The semiconductor package may include a first substrate, and socket bumps configured to protrude from a surface of the first substrate and provide insertion grooves within the socket bumps. The semiconductor package may include a second substrate positioned to face the first substrate, and plug bumps disposed to protrude from a surface of the first substrate toward the first substrate and configured for insertion into the insertion grooves of the socket bumps. The plug bumps configured to move in the insertion grooves with a reciprocating motion and may be electrically connected to the socket bumps, respectively.

According to an embodiment, there may be provided a memory card including a package. The package may include a first substrate and socket bumps disposed on the first substrate and configured for providing insertion grooves. The package may include a second substrate and plug bumps disposed on the second substrate and configured for insertion into the insertion grooves of the socket bumps. The plug bumps may be electrically connected to the socket bumps, respectively.

According to an embodiment, there may be provided a memory card including a package. The package may include a first substrate and bump grooves included in the first substrate and formed in the first substrate adjacent to a surface of the first substrate. The package may include socket bumps respectively disposed in the bump grooves. Each of the socket bumps covers a bottom portion and a sidewall portion of any one of the bump grooves to provide an insertion groove within the socket bumps. The package may include a second substrate disposed to face the first substrate. Plug bumps inserted into the insertion grooves of the socket bumps may be disposed on the second substrate. The plug bumps may be electrically connected to the socket bumps, respectively. The bump groves may be concave.

According to an embodiment, there may be provided a memory card including a package. The package may include a first substrate, and socket bumps configured to protrude from a surface of the first substrate and provide insertion grooves within the socket bumps. The package may include a second substrate positioned to face the first substrate, and plug bumps disposed to protrude from a surface of the first substrate toward the first substrate and configured for insertion into the insertion grooves of the socket bumps. The plug bumps configured to move in the insertion grooves with a reciprocating motion and may be electrically connected to the socket bumps, respectively.

According to an embodiment, there may be provided an electronic system including a package. The package may include a first substrate, and socket bumps disposed on the first substrate and configured to provide insertion grooves. The package may include a second substrate, and plug bumps disposed on the second substrate and configured for insertion into the insertion grooves of the socket bumps. The plug bumps may be electrically connected to the socket bumps, respectively.

According to an embodiment, there may be provided an electronic system including a package. The package may include a first substrate including and bump grooves included in the first substrate and formed in the first substrate adjacent to a surface of the first substrate. The package may include socket bumps respectively disposed in the bump grooves. Each of the socket bumps may cover a bottom portion and a sidewall portion of any one of the bump grooves to provide an insertion groove within the socket bumps. A second substrate may be disposed to face the first substrate. Plug bumps disposed on the second substrate and configured for insertion into the insertion grooves of the socket bumps. The plug bumps may be electrically connected to the socket bumps, respectively. The bump groves may be concave.

According to an embodiment, there may be provided an electronic system including a package. The package may include a first substrate, and socket bumps configured to protrude from a surface of the first substrate and provide insertion grooves within the socket bumps. The package may include a second substrate positioned to face the first substrate, and plug bumps disposed to protrude from a surface of the first substrate toward the first substrate and configured for insertion into the insertion grooves of the socket bumps. The plug bumps configured to move in the insertion grooves with a reciprocating motion and may be electrically connected to the socket bumps, respectively.

BRIEF DESCRIPTION OF THE DRAWINGS

FIG. 4 is a cross-sectional view illustrating a representation of an example of a socket plug interconnection structure of a semiconductor package according to an embodiment.

DETAILED DESCRIPTION

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the description.

The semiconductor package may include electronic components such as semiconductor chips, and the semiconductor chips may be obtained by separating a semiconductor substrate such as a wafer into a plurality of pieces using a die sawing process.

The semiconductor chips may correspond to memory chips or logic chips. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on and/or in the semiconductor substrate. The logic chips may include logic circuits which are integrated on and/or in the semiconductor substrate. The semiconductor package may be applied to information terminals such as mobile communication devices, electronic systems associated with bio or health care, and wearable electronic systems.

Various embodiments may be directed to semiconductor packages with socket plug interconnection structures, memory cards including the same, and electronic systems including the same.

Figure 1:
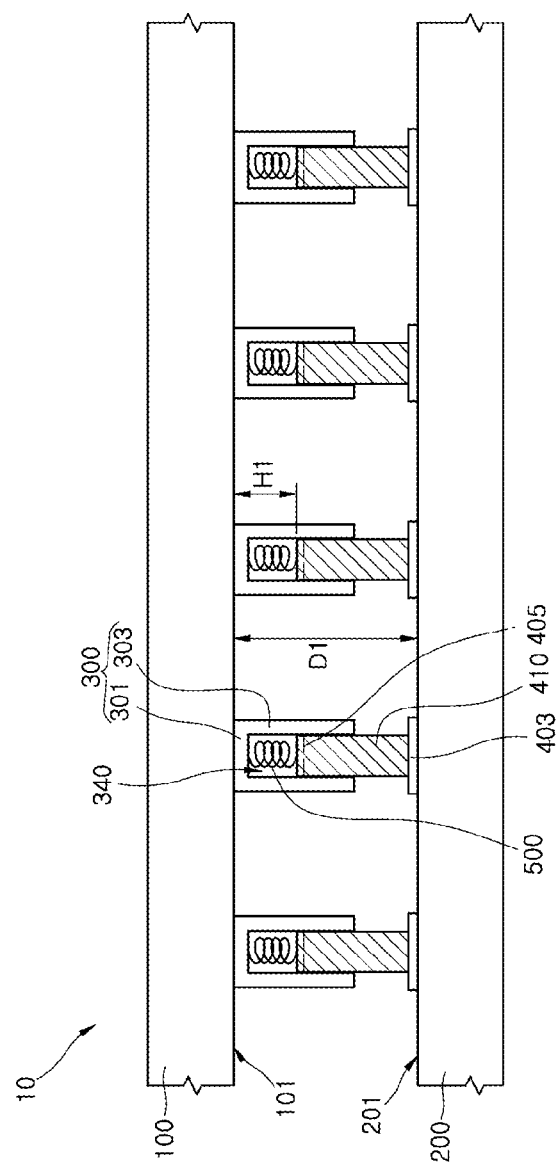
FIGS. 1 to 3 are cross-sectional views illustrating a representation of an example of a semiconductor package according to an embodiment.
Figure 2:
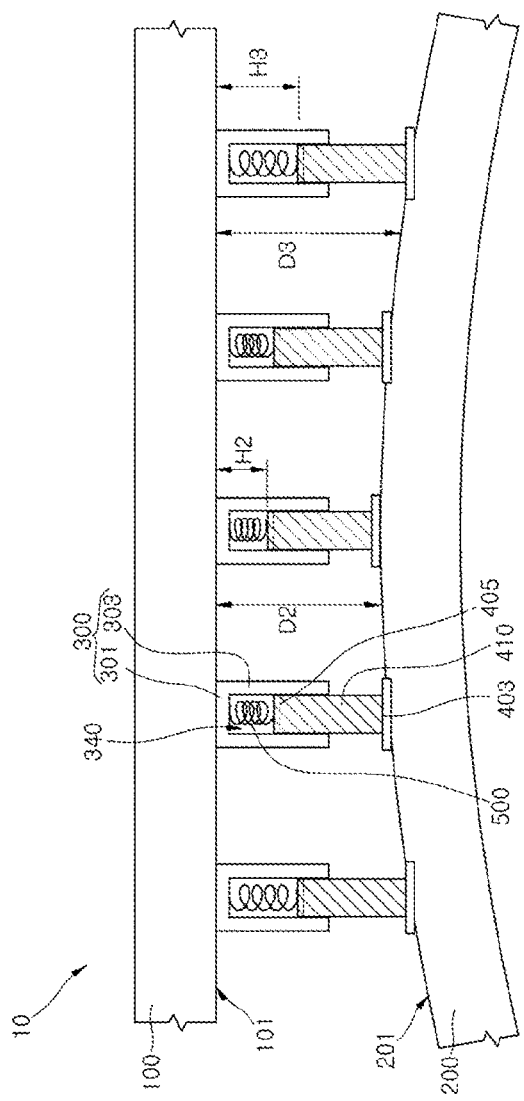
Figure 3:
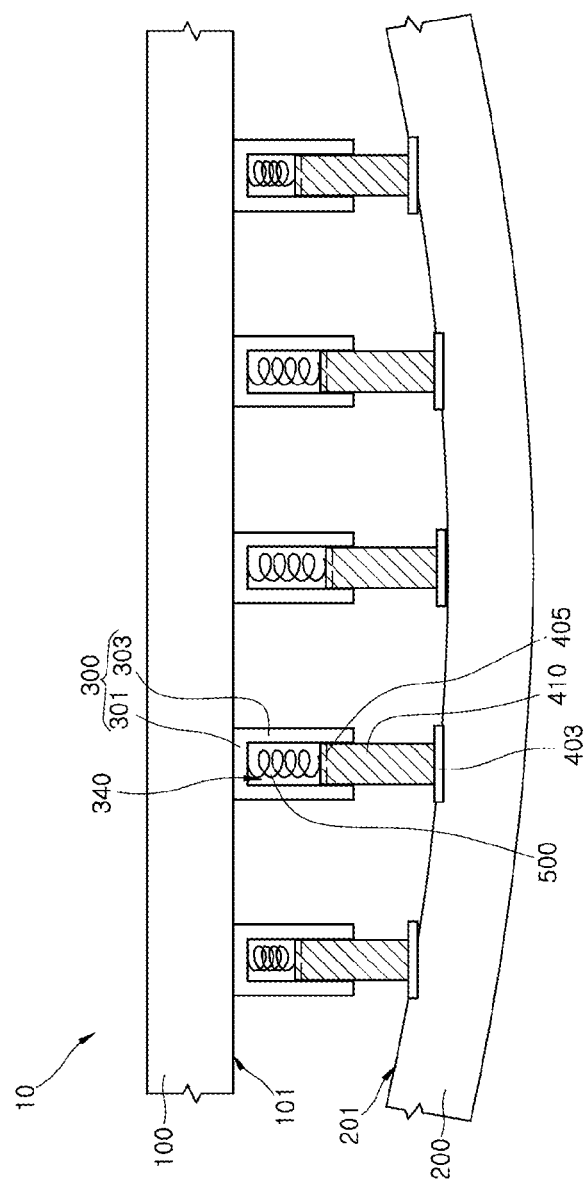

FIGS. 1 to 3 are cross-sectional views illustrating a representation of an example of a semiconductor package 10 according to an embodiment. FIG. 4 is a cross-sectional view illustrating a representation of an example of a socket plug interconnection structure of the semiconductor package according to an embodiment.

Referring to FIG. 1, the semiconductor package 10 may include a first substrate 100 and a second substrate 200. The first substrate 100 and the second substrate 200 may be stacked. The semiconductor package 10 may include a socket plug interconnection structure 300+410 as connection means for electrically and signally connecting the first substrate 100 to the second substrate 200.

The first substrate 100 may be a wafer substrate, a semiconductor die, or a semiconductor chip on which integrated circuits are realized by semiconductor processes. The first substrate 100 may be a package substrate on or in which semiconductor dies or chips are mounted or embedded when the semiconductor dies or chips are packaged by a packaging technology to form the semiconductor package. The package substrate may be a PCB (Printed Circuit Board). The second substrate 200 may be a wafer substrate, semiconductor die, or semiconductor chip on which the integrated circuits are realized by semiconductor processes. The second substrate 200 may be a package substrate on or in which semiconductor dies or chips are mounted or embedded when the semiconductor dies or chips are packaged by a packaging technology to form the semiconductor package. The package substrate may be a PCB (Printed Circuit Board).

The first substrate 100 may be a member including a semiconductor chip and the second substrate 200 may be a package substrate on which a semiconductor chip is to be mounted. The semiconductor chip may be thin enough to be warped or bent. For example the semiconductor chip may be warped or bent by the force applied from an external environment. The package substrate may be introduced to be a substrate having a flexibility property, that is, the package substrate can be warped or bent.

Referring to FIGS. 1 and 4, socket bumps 300 providing socket plug interconnection structures 300+410 may be disposed on a first surface 101 of the first substrate 100 facing the second substrate 200. The socket bumps 300 may act as connection members electrically connecting the first substrate 100 to the second substrate 200. Plug bumps 410 may be disposed on a second surface 201 of the second substrate 200 facing the first substrate 100 to respectively correspond to the socket bumps 300. The plug bumps 410 may be inserted into insertion grooves 340 provided inside of the socket bump 300. The plug bumps 410 may be inserted into the insertion grooves 340 of the socket bumps 300 to mechanically contact the socket bumps 300. The plug bumps 410 may be inserted into the socket bumps 300 so that side surfaces (443 of FIG. 4) of the plug bumps 410 may be in contact with the inner side surface 343 of a sidewall 303 providing the insertion grooves 340 of the socket bumps 300.

The socket bump 300 may include a first bottom portion 301 contacting the first surface 101 of the first substrate 100 and a sidewall portion 303 extending from the bottom portion 301 to be perpendicular or substantially perpendicular to the first surface 101. The portion pertaining to the sidewall 303 may have a cylindrical feature or substantially a cylindrical feature to provide the insertion groove 340 within the sidewall 303. The first bottom portion 301 of the socket bump 300 may be a member connected to other circuit wiring line (not illustrated) disposed on the first substrate 100, may be a conductive line pattern corresponding to a part of a circuit wiring line, or may be a member electrically connected to other devices (not illustrated) embedded or mounted in or on the first substrate 100. The socket bump 300 may include a conductive material. In an embodiment, the socket bump 300 may include a conductive metal such as, for example but not limited to, Cu or Sn.

The plug bumps 410 may be provided to be perpendicular or substantially perpendicular to a second bottom portion 403 contacting the second surface 201 of the second substrate 100. The plug bump 410 may have a shape protruding from the second surface 201 toward the first substrate 100 or a shape of a pillar erected toward the first substrate 100. The plug bump 410 may be inserted into the insertion groove 340 to slide and move up and down along the surface of the inner side surface 343 of the sidewall 303 of the socket bump 300. A conductive interface layer allowing the sliding action of the plug bump 300 may be introduced between a portion of the side surface 443 of the plug bump 410 and the inner side surface 343 of the inner side of the socket bump 300 for electrical connection between the socket bump 300 and the plug bump 410. However, an introduction of a combination layer for combining the portion of the side surface 443 of the plug bump 410 with the inner side surface 343 of the inner side of the socket bump 300 can be excluded to allow smooth sliding and up-down operations.

An retractile conductive connection member 500 for electrically connecting the socket bump 300 to the plug bump 410 may be introduced between the first bottom portion 301 of the socket bump 300 and a front end 405 of the plug bump 410. The retractile conductive connection member 500 may be capable of being drawn in. The retractile conductive connection member 500 may be stretchable or elastic. The retractile conductive connection member 500 may be introduced as a member being compressed when the plug bump 410 moves up to be close to the first bottom portion 301 and extending when the plug bump 410 moves down and away from the first bottom portion 301. Referring to FIG. 4, a first end 501 of the retractile conductive connection member 500 may contact the first bottom portion 301 of the socket bump 300. A second end 504 of the retractile conductive connection member 500 may contact the front end 405 of the plug bump 410 so that the retractile conductive connection member 500 can further complement the electrical connection between the socket bump 300 and the plug bump 410. Although the retractile conductive connection member 500 is not combined with the first bottom portion 301 of the socket bump 300 or the front end 405 of the plug bump 410, both ends 501 and 504 of the retractile conductive connection member 500 may be in contact with the first bottom portion 301 of the socket bump 300 and the front end 405 of the plug bump 410 respectively, if the plug bump 410 is inserted into the insertion groove 340 of the socket bump 300 and compressed. Alternatively, the first end 501 of the retractile conductive connection member 500 may be in contact with and combined with the surface 341 of the first bottom portion 301 of the socket bump 300. Alternatively, the second end 504 of the retractile conductive connection member 500 may be in contact with and combined with the front end 405 of the plug bump 410.

The retractile conductive connection member 500 may include an elastic member such as a conductive spring. The elastic member may be compressed or stretched elastically as the plug bump 410 moves up or down so that the elastic member can provide elastic recovery force. The conductive spring may have a linear spring shape extending from the first bottom portion 301 of the socket bump 300 to the front end 405 of the plug bump 410. The conductive spring may have a shape of spring coil spirally wound to extend from the first bottom portion 301 of the socket bump 300 to the front end 405 of the plug bump 410.

Referring to FIGS. 1 and 2, each of the plug bumps 410 may be inserted into any one of the insertion grooves 340 of the socket bumps 300 to partly fill the insertion groove 340, for example, to fill only a half of the insertion groove 340 without full filling the insertion groove 340, so that the first surface 101 of the first substrate 100 and the second surface 201 of the second substrate 200 are spaced apart from each other by a first distance D1 corresponding to an initial distance. Accordingly, the front end 405 of the plug bump 410 may be located at a position of a first height H1 from the first surface 101. The front end 405 of the plug bump 410 may be introduced to be spaced apart from the first bottom portion 301 of the socket bump 300 by a predetermined distance. The retractile conductive connection member 500 may be introduced into a space between the first bottom portion 301 of the socket bump 300 and the front end 405 of the plug bump 410.

Referring to FIG. 2, when both edges of the second substrate 200 are bent down by external force so that the second substrate 200 exhibits a crying shape or a convex shape curving inward or toward the first surface 101 of the first substrate 100, a central portion of the first substrate 100 and a central portion of the second substrate 200 may be spaced apart from each other by a second distance D2, and the second distance D2 may be different from the first distance D1. For example, the second distance D2 may be less than the first distance D1 when the second substrate 200 exhibits the convex shape toward the first surface 101. In such an example, edges of the first substrate 100 may be spaced apart from edges of the second substrate 200 by a third distance D3, and the third distance D3 may be different from the first distance D1. For example the third distance D3 may be greater than the first distance D1 when the second substrate 200 exhibits the convex shape toward the first surface 101. The plug bumps 410 may move up and down in the insertion grooves 340 in compliance with the external force, and each of the front ends 405 of the plug bumps 410 may be located at a second height H2 or a third height H3 from the first surface 101 of the first substrate 100. Nevertheless, electrical connection between the first substrate 100 and the second substrate 200 may be maintained because the side portion (i.e., 443 of FIG. 4) of the plug bump 410 and inner side (i.e., 343 of FIG. 4) may still be in contact with each other. Similarly, electrical connection between the first substrate 100 and the second substrate 200 may also be maintained even when the first substrate 100 is bent.

Referring to FIG. 3, when both edges of the second substrate 200 are bent up by external force so that the second substrate 200 exhibits a smile shape or a concave shape curving outward or away from the first surface 101 of the first substrate 100, a central portion of the first substrate 100 and a central portion of the second substrate 200 may be spaced apart from each other by a certain distance different from the first distance D1 and a distance between an edge of the first substrate 100 and an edge of the second substrate 200 may also be changed. Nevertheless, electrical connection between the first substrate 100 and the second substrate 200 may be maintained because the side (i.e., 443 of FIG. 4) part of the plug bump 410 and the inner side surface 343 of the socket bump 300 may still be in contact with each other. Electrical connection between the first substrate 100 and the second substrate 200 may be maintained even when the first substrate 100 is bent.

Figure 5:
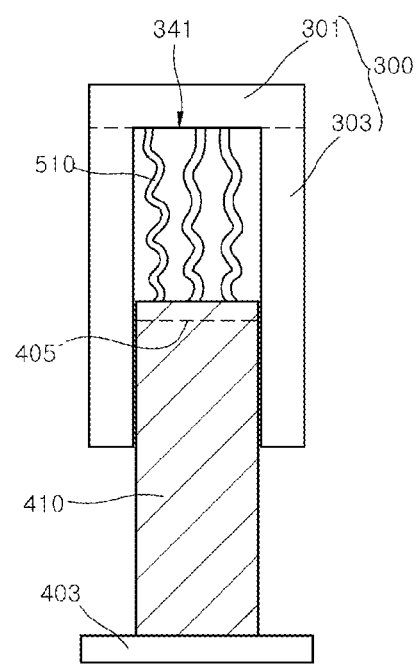
FIG. 5 is a vertical cross-sectional view illustrating a representation of an example of other socket plug interconnection structures employed in a semiconductor package according to various embodiments.

FIG. 5 illustrates a representation of an example of other socket plug interconnection structures employed in a semiconductor package according to various embodiments.

Referring to FIG. 5, conductive nano wires may be introduced between the first bottom portion 301 of the socket bump 300 constituting the socket plug connection structure 300+410 and the front end 405 of the plug bump 410 as an retractile conductive connection member 510 for electrically connecting the socket bump 300 to the plug bump 410. The conductive nano wires constituting the retractile conductive connection member 510 may be grown from the surface 341 of the first bottom portion 301 of the socket bump 300. The conductive nano wires may have a bent or curved shape or substantially perpendicularly erected shape, and may be introduced in the structures tangled with each other. The conductive nano wires may be grown from the first bottom portion 301 using, for example but not limited to, a nano wire formation technique.

The retractile conductive connection member 510 may include, for example but not limited to, carbon nanotubes. The carbon nanotubes may be grown from the first bottom portion 301 of the socket bump 300 using, for example but not limited to, a carbon nanotube formation technique. The carbon nanotubes may be grown and arranged from the first bottom portion 301 to be substantially perpendicular to the surface 341 of the first bottom portion 301. The carbon nanotubes may have intermittently bent or curved shape and may be introduced in the structure tangled with each other.

Figure 6:
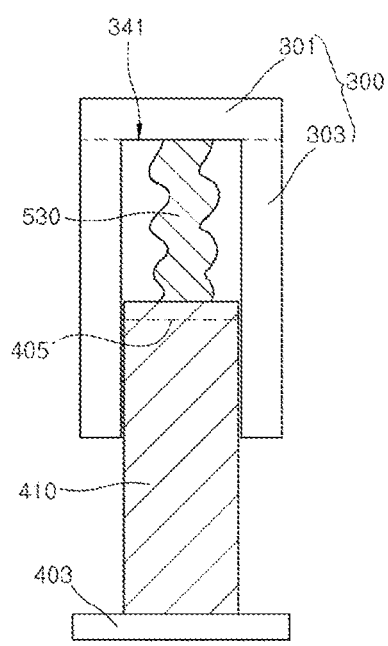
FIG. 6 is a vertical cross-sectional view illustrating a representation of an example of other socket plug interconnection structure employed in a semiconductor package according to various embodiments.

FIG. 6 illustrates a representation of an example of other socket plug interconnection structures employed in a semiconductor package according to various embodiments.

Referring to FIG. 6, an retractile conductive connection member 530 electrically connecting the socket bump 300 to the plug bump 410 may be introduced between the surface 341 of the first bottom portion 301 of the socket bump 300 and the front end 405 of the plug bump 410. The retractile conductive connection member 530 may include conductive elastic materials. The conductive elastic material may be a polymer material containing conductive particles or a conductive polymer material.

Figure 7:
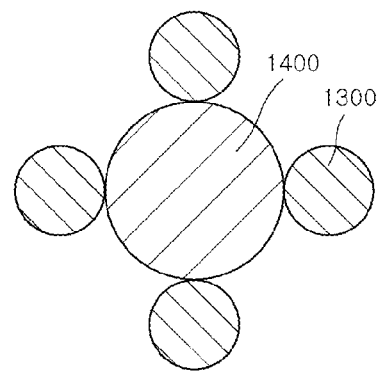
FIG. 7 and FIG. 8 are horizontal cross-sectional views illustrating a representation of an example of other socket plug interconnection structures employed in a semiconductor package according to various embodiments.
Figure 8:
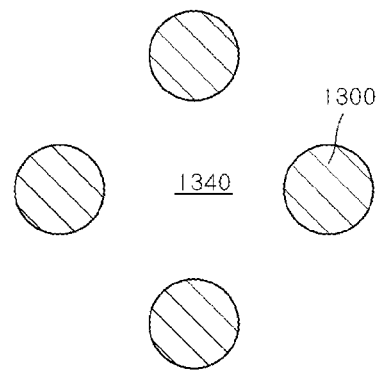

FIGS. 7 and 8 illustrate a representation of an example of other socket plug interconnection structures employed in a semiconductor package according to various embodiments.

Referring to FIGS. 7 and 8, the socket bump (i.e., see FIGS. 1-6) may include sidewall pillars 1300 protruding from a bottom portion of the socket bump to provide an insertion groove 1340 surrounded by or substantially surrounded by the sidewall pillars 1300. The number of the sidewall pillars 1300 constituting each socket plug interconnection structure may be at least two so that the insertion groove 1340 is provided between the sidewall pillars 1300 functioning as the sidewall portion 303 of, for example, FIG. 4. A plug bump 1400 may be inserted into the insertion groove 1340 provided by the sidewall pillars 1300, and the sidewall pillars 1300 may act as restriction bars that prevent the plug bump 1400 from departing from the insertion groove 1340. Each of the sidewall pillars 1300 may have a line width smaller than that of the plug bump 1400.

Figure 9:
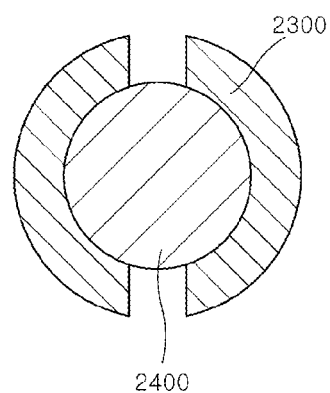
FIG. 9 and FIG. 10 are horizontal cross-sectional views illustrating a representation of an example of other socket plug interconnection structures employed in a semiconductor package according to various embodiments.
Figure 10:
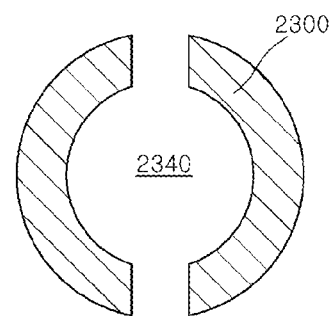

FIGS. 9 and 10 illustrate a representation of an example of other socket plug interconnection structures employed in a semiconductor package according to various embodiments.

Referring to the FIGS. 9 and 10, a socket bump (i.e., see FIGS. 1-6) may include sidewall portions 2300 protruding from a bottom portion of the socket bump and are separated from each other to provide an insertion groove 2340 between the sidewall portions 2300. The number of the sidewall portions 2300 may be at least two so that the insertion groove 2340 is provided between the sidewall portions 2300 functioning as a portion of the sidewall 303 of FIG. 4. The number of the sidewall portions 2300 may be two, as illustrated in FIGS. 9 and 10. However, the number of the sidewall portions 2300 is not limited to two. For example, in some embodiments, the number of the sidewall portions 2300 may be three or more to provide a surrounding for the insertion groove 2340. A plug bump 2400 may be inserted into the insertion groove 2340 surrounded by or substantially surrounded by the separated sidewall portions 2300, and the sidewall portions 2300 may act as restriction members preventing the plug bump 2400 from departing from the insertion groove 2340.

Figure 11:
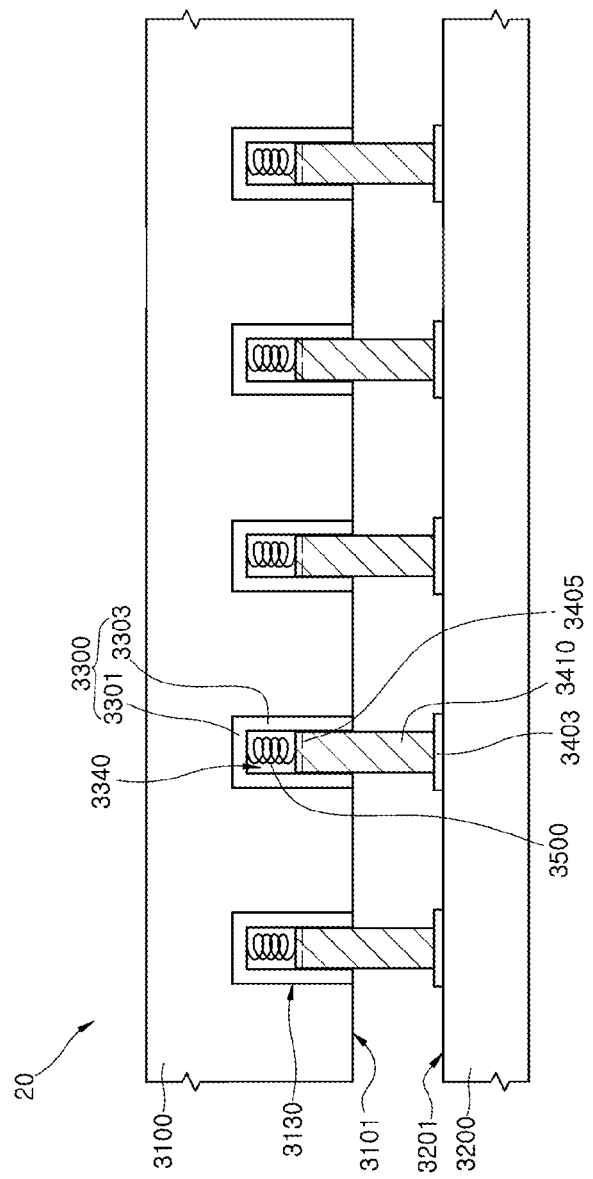
FIG. 11 and FIG. 12 are cross-sectional views illustrating a representation of an example of a semiconductor package according to an embodiment.
Figure 12:
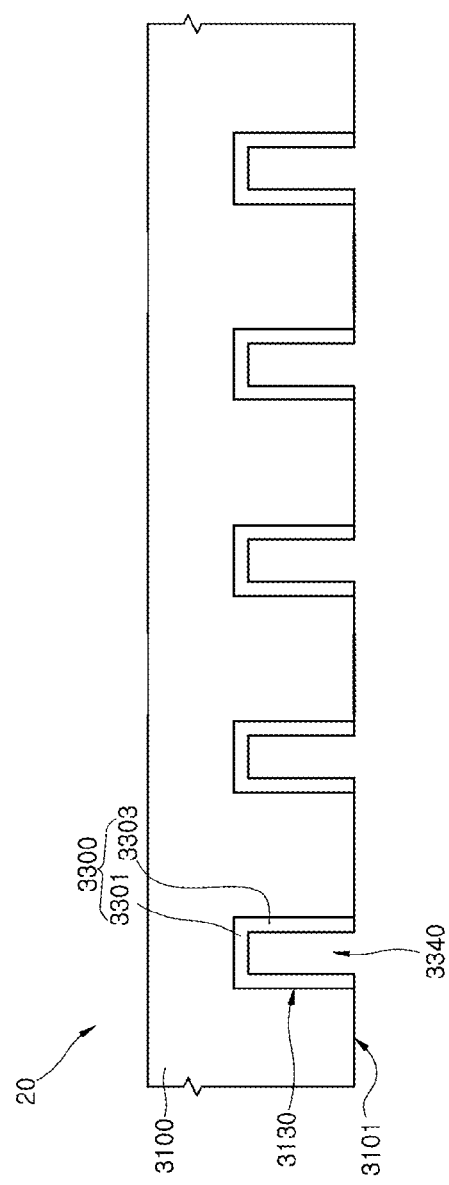

FIGS. 11 and 12 are cross-sectional views illustrating a representation of an example of a semiconductor package according to an embodiment.

Referring to FIGS. 11 and 12, the semiconductor package 20 may include a first substrate 3100 and a second substrate 3200 stacked and may further include a plurality of socket plug connection structures 3300+3410 as connection means for electrically and signally connecting the first substrate 3100 to the second substrate 3200. The plurality of socket bumps 3300 may be respectively disposed in bump grooves 3130 formed in the first substrate 3100 adjacent to a first surface 3101 of the first substrate 3100. A first bottom portion 3301 of the socket bump 3300 may be located to cover a bottom surface of the bump groove 3130, and a sidewall portion 3303 of the socket bump 3300 may be located to cover a sidewall portion of the bump groove 3130. A plurality of plug bumps 3410 may be disposed on a second surface 3201 of the second substrate 3200. The plug bump 3410 may be inserted into an insertion groove 3340 provided in the socket bump 3300. The plug bump 3410 may be inserted into the insertion groove 3340 to provide an electrical connection and a mechanical connection with the socket bump 3300.

Retractile conductive connection members 3500 may be introduced to electrically connect the socket bumps 3300 to the plug bumps 3410 and may be disposed between the first bottom portions 3301 of the socket bumps 3300 and the front ends 3405 of the plug bumps 3410, respectively. The retractile conductive connection member 3500 may be introduced as a member compressed when the plug bump 3410 moves up to be close to the first bottom portion 3301 and extends when the plug bump 3410 moves down away from the first bottom portion 3301. The plug bumps 3410 may be provided to be perpendicular or substantially perpendicular to a second bottom portion 3403 contacting the second surface 3201 of the second substrate 3200.

Figure 13:
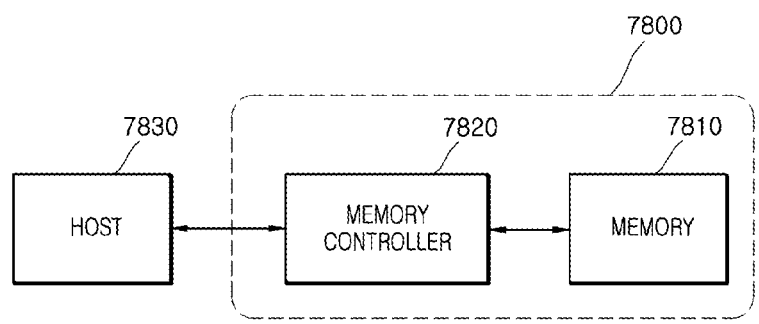
FIG. 13 is a block diagram illustrating a representation of an example of an electronic system employing a memory card including a package in accordance with an embodiment.

FIG. 13 is a block diagram illustrating a representation of an example of an electronic system including a memory card 7800 including at least one semiconductor package according to an embodiment.

The memory card 7800 includes a memory 7810, such as a nonvolatile memory device, and a memory controller 7820. The memory 7810 and the memory controller 7820 may store data or read stored data. The memory 7810 and/or the memory controller 7820 include one or more semiconductor chips disposed in an embedded package according to an embodiment (i.e., see FIGS. 1-11 and associated text). The memory 7810 may include a nonvolatile memory device to which the technologies of the embodiments of the present disclosure are applied. The memory controller 7820 may control the memory 7810 such that stored data is read out or data is stored in response to a read/write request from a host 7830.

Figure 14:
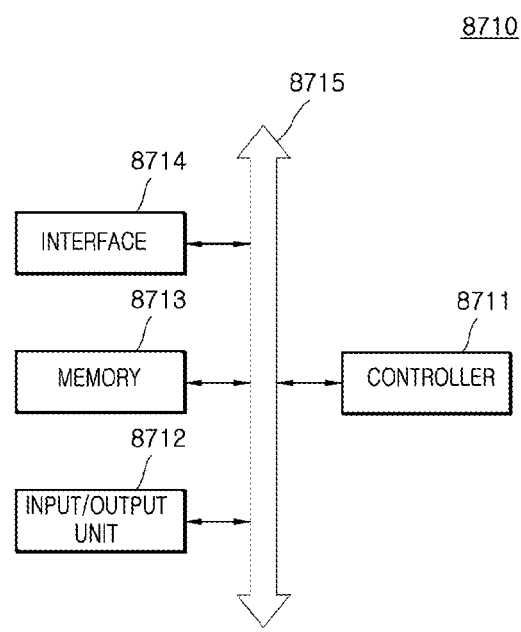
FIG. 14 is a block diagram illustrating a representation of an example of an electronic system including a package according to an embodiment.

FIG. 14 is a block diagram illustrating a representation of an example of an electronic system 8710 including at least one package according to an embodiment (i.e., see FIGS. 1-13 and associated text). The electronic system 8710 may include a controller 8711, an input/output unit 8712, and a memory 8713. The controller 8711, the input/output unit 8712 and the memory 8713 may be coupled with one another through a bus 8715 providing a path through which data moves.

In an embodiment, the controller 8711 may include one or more microprocessors, digital signal processors, microcontrollers, and/or logic devices capable of performing the same functions as these components. The controller 8711 or the memory 8713 may include one or more of the semiconductor packages according to the various embodiments of the present disclosure (i.e., see FIGS. 1-13 and associated text). The input/output unit 8712 may include at least one selected among a keypad, a keyboard, a display device, a touch screen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a first substrate;
   socket bumps disposed on the first substrate and configured for providing insertion grooves;
   a second substrate; and
   plug bumps disposed on the second substrate, each of the plug bumps is configured for insertion into each of the insertion grooves, respectively, to electrically connect to the socket bumps, respectively,
   wherein the socket bump includes a sidewall portion providing the inserting groove, and
   wherein the plug bump is capable of moving up and down along an inner side surface of the sidewall portion of the socket bump in compliance with an external force.

2. The semiconductor package of claim 1, wherein the first substrate comprises a semiconductor chip including integrated circuits.

3. The semiconductor package of claim 2,
   wherein the second substrate comprises a package substrate, and
   wherein the semiconductor chip is mounted on the package substrate.

4. The semiconductor package of claim 1, wherein each of the socket bumps comprise sidewall pillars protruding from a first bottom portion of the socket bumps to substantially surround the insertion groove with the sidewall pillars.

5. The semiconductor package of claim 4, wherein each of the sidewall pillars includes a line width less than a line width of the plug bump.

6. The semiconductor package of claim 1,
   wherein each of the socket bumps comprises a sidewall protruding from first bottom portions of the socket bumps, respectively, and each of the sidewalls are configured to allow each of the plug bumps to remain within the insertion groves of the socket bumps, respectively.

7. A semiconductor package comprising:
   a first substrate;
   socket bumps disposed on the first substrate and configured for providing insertion grooves;
   a second substrate;
   plug bumps disposed on the second substrate, each of the plug bumps is configured for insertion into each of the insertion grooves, respectively, to electrically connect to the socket bumps, respectively; and a retractile conductive connection member including a first end configured for being electrically connected on a bottom surface of the socket bump within the insertion groove and a second end connected to a front end of the inserted plug bump.

8. The semiconductor package of claim 7,
wherein the retractile conductive connection member comprises a conductive spring; and
wherein a first end of the conductive spring is combined with the surface of the socket bump within the insertion groove and an other end of the spring member is combined with the front end of the plug bump.

9. The semiconductor package of claim 8, wherein the conductive spring comprises a spring coil.

10. The semiconductor package of claim 7,
wherein the retractile conductive connection member comprises conductive nano wires between the surface of the socket bump within the insertion groove and the front end of the plug bump, and
wherein the nano wires are bent or tangled with each other.

11. The semiconductor package of claim 7, wherein the retractile conductive connection member comprises bent or tangled conductive carbon nanotubes between the surface of the socket bump within the insertion groove and the front end of the plug bump.

12. The semiconductor package of claim 7, wherein the retractile conductive connection member comprises a conductive elastic member between the surface of the socket bump within the insertion groove and the front end of the plug bump.

13. The semiconductor package of claim 7, wherein the retractile conductive connection member comprises a conductive polymer between the surface of the socket bump within the insertion groove and the front end of the plug bump.

14. The semiconductor package of claim 7,
wherein each of the socket bumps comprises a cylindrical sidewall portion protruding from a first bottom portion of the socket bump.

15. The semiconductor package of claim 14,
wherein the sidewall portion of the socket bump comprises at least two sidewalls separated from each other.

16. A semiconductor package comprising:
a first substrate;
socket bumps configured to protrude from a surface of the first substrate and provide insertion grooves within the socket bumps;
a second substrate positioned to face the first substrate;
plug bumps disposed to protrude from a surface of the second substrate toward the first substrate and configured for insertion into the insertion grooves of the socket bumps; and
a retractile conductive connection member including a first end configured for being electrically connected on a bottom surface of the socket bump within the insertion groove and a second end connected to a front end of the inserted plug bump,
wherein the plug bumps are configured to move in the insertion grooves with a reciprocating motion and are electrically connected to the socket bumps, respectively.

* * * * *